United States Patent
Yamashita et al.

(10) Patent No.: US 7,141,995 B2
(45) Date of Patent: Nov. 28, 2006

(54) SEMICONDUCTOR MANUFACTURING DEVICE AND SEMICONDUCTOR MANUFACTURING METHOD

(75) Inventors: Michio Yamashita, Okazaki (JP); Katuhiko Mori, Nagoya (JP); Takashi Suzuki, Toyota (JP); Teruhiko Uchimura, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/994,277

(22) Filed: Nov. 23, 2004

(65) Prior Publication Data

US 2005/0122124 A1   Jun. 9, 2005

(30) Foreign Application Priority Data

Dec. 3, 2003   (JP) .............................. 2003-404978

(51) Int. Cl.
*G01R 31/02*   (2006.01)
*G01R 31/28*   (2006.01)
*G01R 31/26*   (2006.01)
*H01L 21/82*   (2006.01)

(52) U.S. Cl. ..................... 324/754; 324/158.1; 438/14; 438/128; 438/129; 438/130; 438/131; 438/132

(58) Field of Classification Search ................ None
See application file for complete search history.

(56) References Cited

U.S. PATENT DOCUMENTS 4,786,867 A * 11/1988 Yamatsu ..................... 324/758
5,055,902 A   10/1991 Lambert
5,265,114 A   11/1993 Sun et al.
5,473,624 A   12/1995 Sun
5,569,398 A   10/1996 Sun et al.
5,685,995 A   11/1997 Sun et al.
5,808,272 A   9/1998 Sun et al.
5,841,713 A   11/1998 Maeda
6,111,421 A * 8/2000 Takahashi et al. .......... 324/758
6,872,582 B1 * 3/2005 Pirkle et al. .................. 438/14

FOREIGN PATENT DOCUMENTS

JP   B2-3186105   5/2001

OTHER PUBLICATIONS

ShibaSoku Co., Ltd. "LSI Test Systems Page." Aug. 16, 2004 <http://www.shibasoku.co.jp/index-e.html>.
GSI Lumonics, Inc. "WaferTrim™ M310 Page"<http://www.gsilumonics.com>, no date.
Tokyo Electron Limited. "Semiconductor Production Equipment Page." <http://www.tel.com/eng/products/semiproducts.htm>, no date.

* cited by examiner

*Primary Examiner*—Paresh Patel
*Assistant Examiner*—Roberto Velez
(74) *Attorney, Agent, or Firm*—Posz Law Group, PLC

(57) ABSTRACT

A semiconductor manufacturing device includes a prober whose needles are at once engaged for contacting pads of two chip forming regions within a wafer. In one chip forming region, trimming is performed, while in the other chip forming region, inspecting posterior to trimming is performed.

4 Claims, 10 Drawing Sheets

PRIOR TO TRIMMING

UNDER TRIMMING

PASS

PRIOR TO INSPECTING

UNDER INSPECTING

PASS

NG

SEMICONDUCTOR MANUFACTURING DEVICE AND SEMICONDUCTOR MANUFACTURING METHOD

CROSS REFERENCE TO RELATED APPLICATIONS

This application is based on and incorporates herein by reference Japanese Patent Application No. 2003-404978 filed on Dec. 3, 2003.

FIELD OF THE INVENTION

The present invention relates to a semiconductor manufacturing device and a semiconductor manufacturing method.

BACKGROUND OF THE INVENTION

A conventional semiconductor manufacturing device shown in FIG. 8 includes a trimmer 100 of an IC wafer and a wafer inspecting device 200. The trimmer 100 includes a prober 110, a laser device 120, and a tester 130. Here, as shown in FIG. 9A, a thin film 151 of a trimming object as well as pads 152 is formed in each chip forming region under a wafer state. Here, as shown in FIG. 9B, laser trimming for the thin film 151 is performed (a groove 153 is formed) with probe needles 111 contacting the pads 152 by the prober 110 of the trimmer 100 shown in FIG. 8 so that a given property can be obtained for the thin film 151. The resultant thin film 151 becomes as shown in FIG. 9C.

Further, the wafer inspecting device 200 includes a prober 220 and a tester 210, as shown in FIG. 8. Each chip forming region shown in FIG. 10A is inspected in its property under the wafer state before dicing, using the prober 220, with probe needles 221 contacting the pads 160, as shown in FIG. 10A. When a given property is obtained, the resultant state becomes as shown in FIG. 10C. When the given property is not obtained, the resultant state becomes as shown in FIG. 10D. That is, a bad mark is attached.

Thus, both of the trimmer 100 and the wafer inspecting device 200 perform probing with respect to each of the chips to perform a thin-film trimming and a wafer inspecting, respectively.

As shown in FIG. 8, the thin-film trimmer 100 and the wafer inspecting device 200 are mutually discrete and separated devices. Here, the trimmer 100 includes a dedicated prober 110, a laser device 120, and a tester 130, while the wafer inspecting device 200 includes a tester 210 and a prober 220. Therefore, a common prober that probes each chip of ICs formed in the wafer is required for each of the trimmer 100 and the wafer inspecting device 200. This involves waste in equipment investment and floor areas.

SUMMARY OF THE INVENTION

It is an object of the present invention to provide a semiconductor manufacturing device and a semiconductor manufacturing method, in both of which trimming and inspecting can be performed using simple equipment.

To achieve the above object, a semiconductor manufacturing device is provided with the following. A prober is included for performing trimming for a chip forming region within a wafer while performing inspecting for a chip forming region under a wafer state. A plurality of probing needles are included for being engaged by the prober for at once contacting pads of a plurality of chip forming regions within the wafer. Here, trimming is performed for at least one chip forming region within the plurality of chip forming regions, while inspecting posterior to trimming is performed for the plurality of chip forming regions excluding the at least one chip forming region.

This enables sharing of the prober in both of trimming and inspecting, which enables simple equipment to perform both of trimming and inspecting.

BRIEF DESCRIPTION OF THE DRAWINGS

The above and other objects, features, and advantages of the present invention will become more apparent from the following detailed description made with reference to the accompanying drawings. In the drawings.

DETAILED DESCRIPTION OF THE PREFERRED EMBODIMENTS

Figure 1:
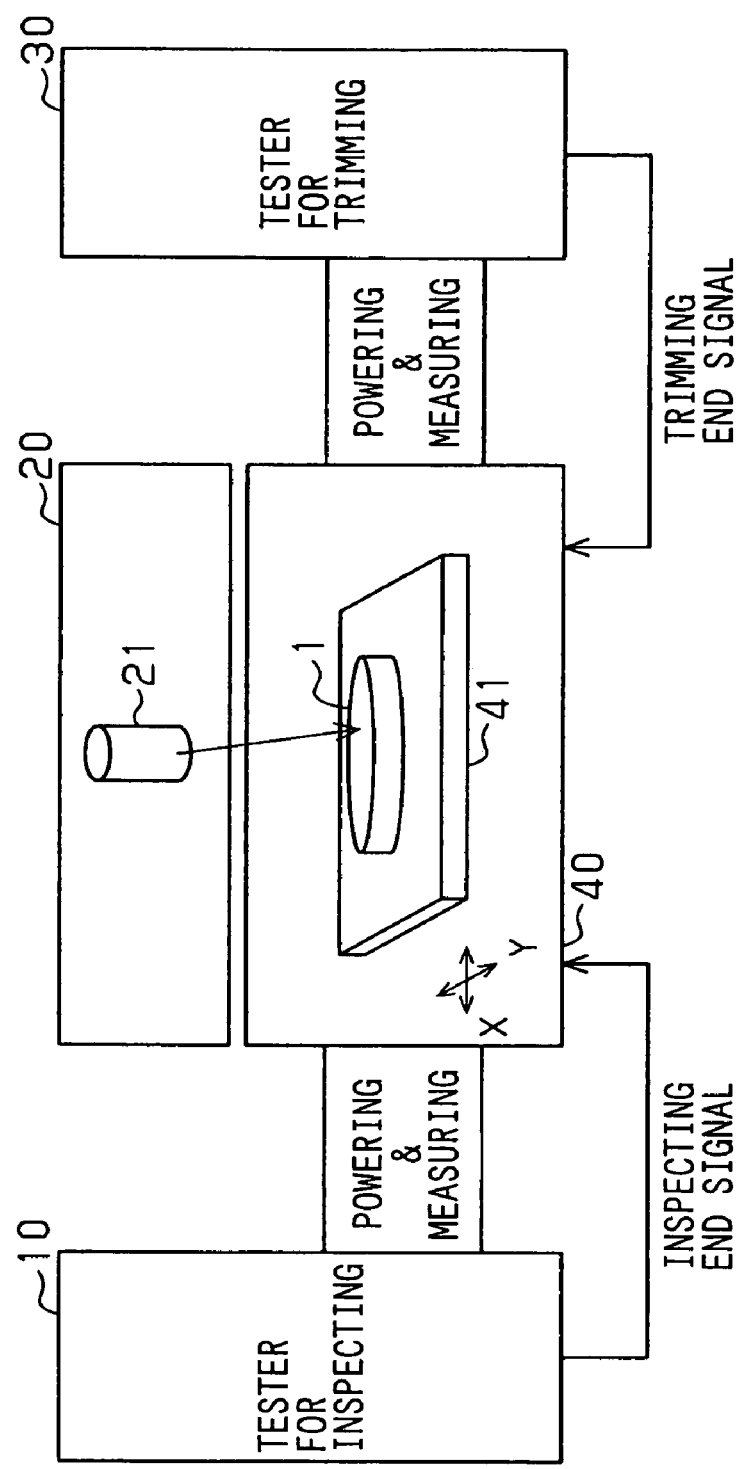
FIG. 1 is a diagram of showing a structure of a semiconductor manufacturing device (a trimmer and a wafer inspecting device) according to an embodiment of the present invention.

Hereinafter, a semiconductor manufacturing device (a trimmer for an IC wafer and a wafer inspecting device) according to an embodiment of the present invention will be explained. The semiconductor manufacturing device includes a tester 10 for wafer inspecting (or wafer-inspecting tester), a laser device 20, a tester 30 for a trimmer (or trimming tester), and a shared prober 40. The laser device 20 is provided with a laser oscillating unit 21. The shared prober 40 is provided with a wafer stage 41, on which a wafer 1 is mounted. The wafer stage 41 moves to an x direction and a y direction. The wafer 1 on the wafer stage 41 is irradiated by a laser beam outputted from the laser oscillating unit 21 of the laser device 20.

Figure 2A:
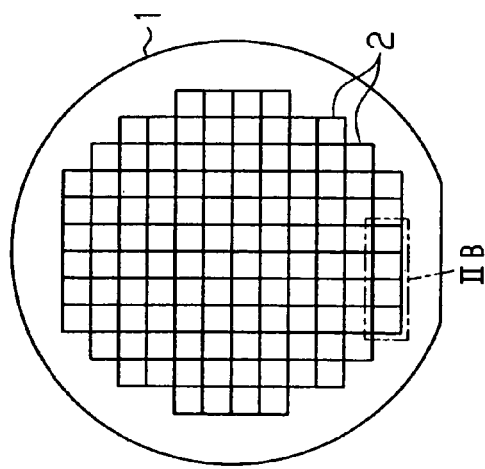
FIGS. 2A, 2B are plan views of a wafer and its enlarged portions.
Figure 2B:
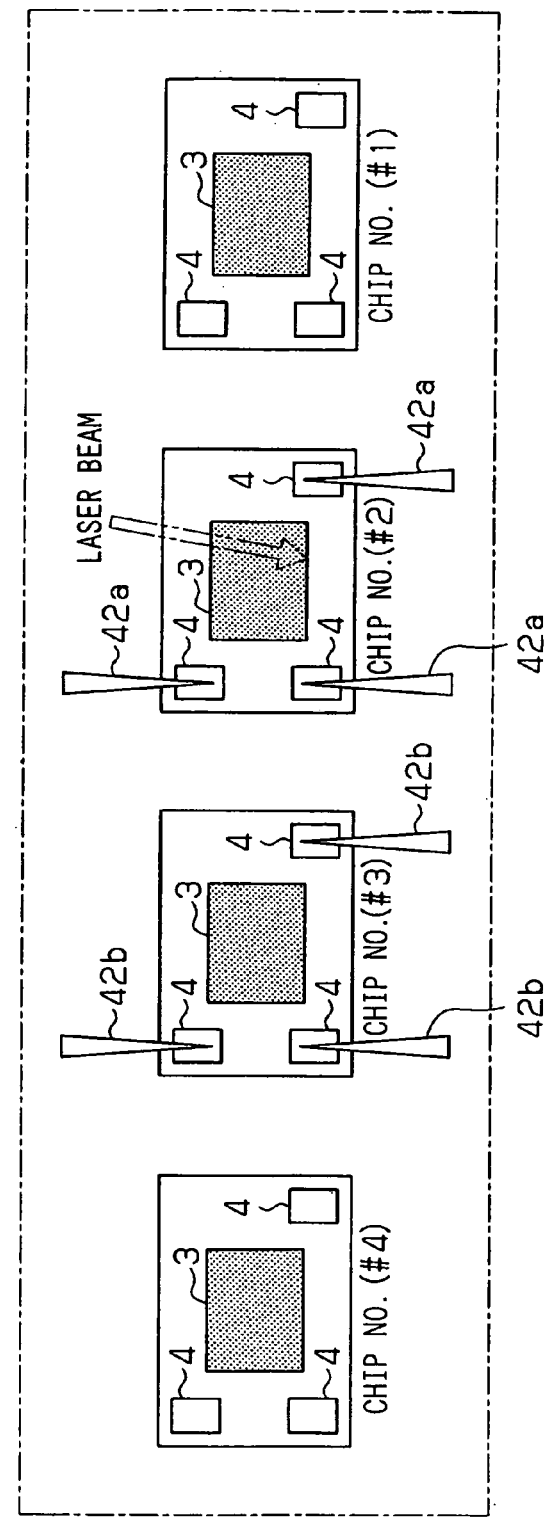

The wafer 1 includes multiple chip forming regions 2 as shown in FIG. 2. In the lower portion of FIG. 2, of the multiple chip forming regions 2, four chip forming regions 2 are enlarged to be shown as chip Nos. 1 to 4. Each of the chip forming regions (chip Nos. 1 to 4) includes a thin film 3 on it as a trimming object and also pads 4.

The prober in FIG. 1 includes probe needles 42a, 42b that can be at once engaged for contacting pads on adjacent chip forming regions (chip Nos. 2, 3). The probe needles 42a are for laser trimming, while the probe needles 42b are for wafer inspecting.

Further, in FIG. 1, the shared prober 40 is connected with the wafer-inspecting tester 10 and the trimming tester 30. The wafer-inspecting tester 10 supplies the shared prober 40 with electric power, so that measurement can be executed. Likewise, the trimming tester 30 supplies the shared prober 40 with electric power, so that measurement can be executed.

The trimming tester 30 sends a trimming end signal to the shared prober 40 when the trimming ends. Further, the wafer-inspecting tester 10 sends an inspecting end signal to the shared prober 40 when the inspecting ends.

Figure 3:
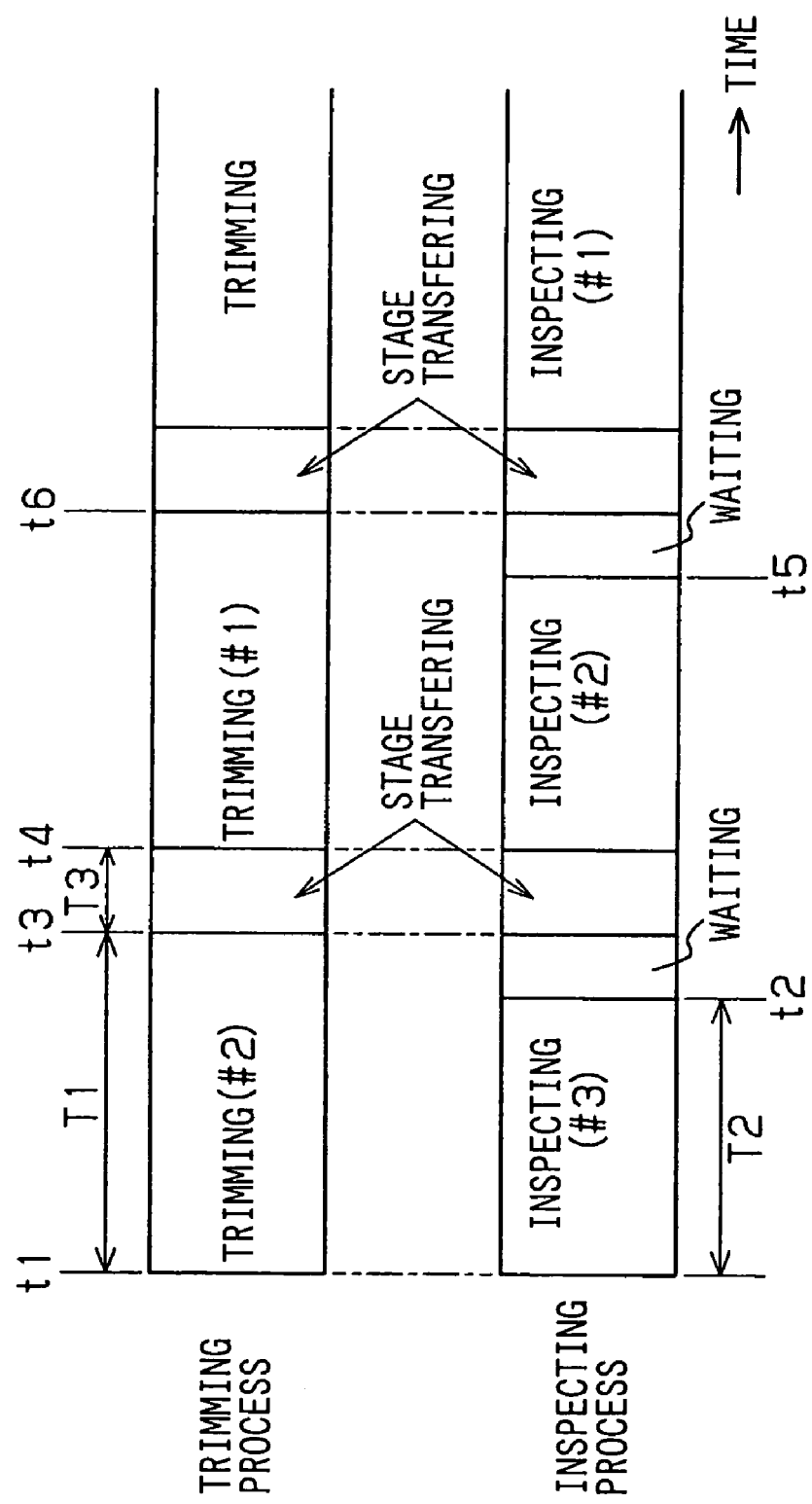
FIG. 3 is a time chart diagram showing process timings of trimming and inspecting.
Figure 4:
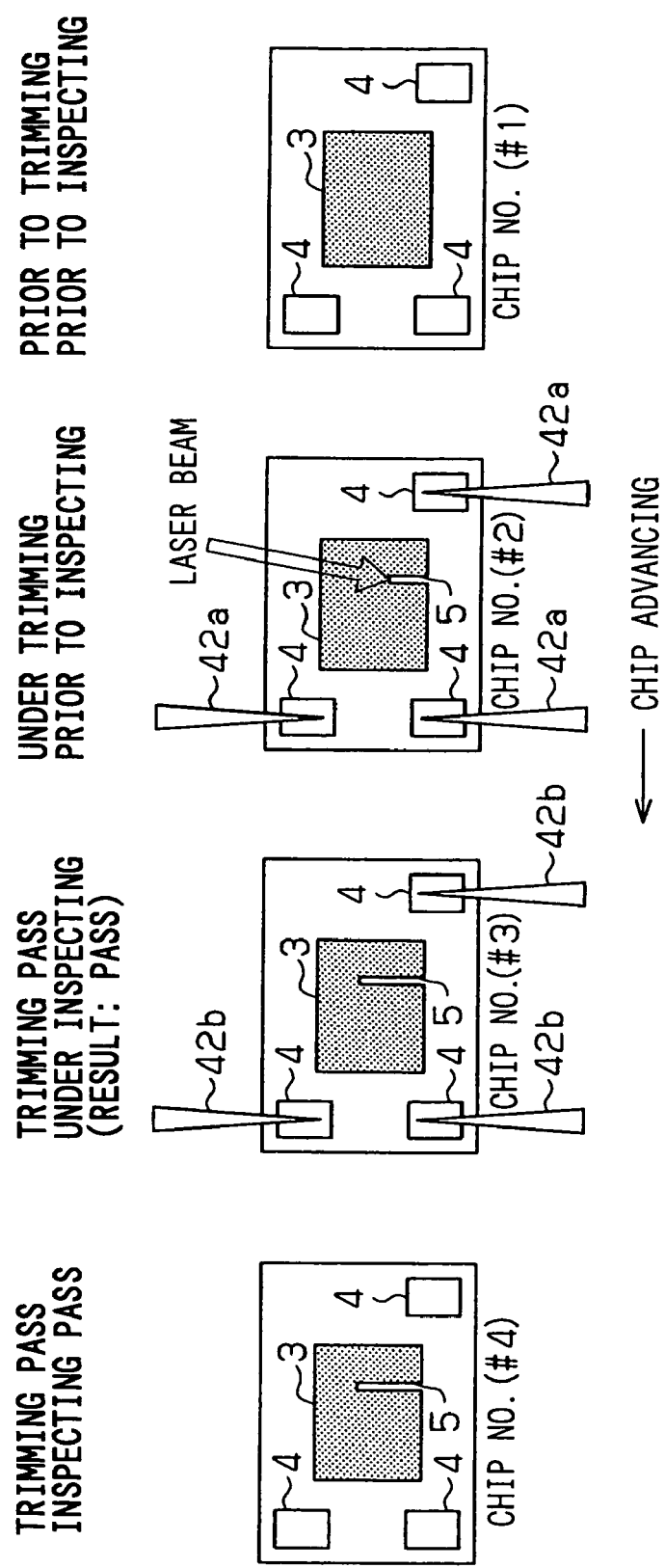
FIG. 4 is a plan view showing a process of trimming and inspecting in enlarged portions of a wafer.

Next, a function of the semiconductor device, i.e., a trimming and wafer-inspecting method will be explained below. FIG. 3 shows a time chart diagram of a trimming process and an inspecting process. As shown in FIG. 4, the probe needles 42a, 42b are at once engaged for contacting pads of adjacent chip forming regions (chip Nos. 2, 3) within the wafer 1, respectively. Under this condition, laser trimming is performed (a groove 5 is formed) to a thin film 3 on the chip forming region (chip No. 2) using the probe needles 42a so as to obtain a given property. Simultaneously, inspecting posterior to trimming is performed to a thin film 3 on the chip forming region (chip No. 3) using the probe needles 42b.

That is, using the prober 40, trimming is performed on one of the chip forming regions 2 which the probe needles 42a, 42b are engaged for contacting, while inspecting posterior to trimming is performed on the other of the chip forming regions 2. This trimming uses the laser device 20 and the trimming tester 30, while the wafer inspecting uses the wafer-inspecting tester 10.

Figure 5:
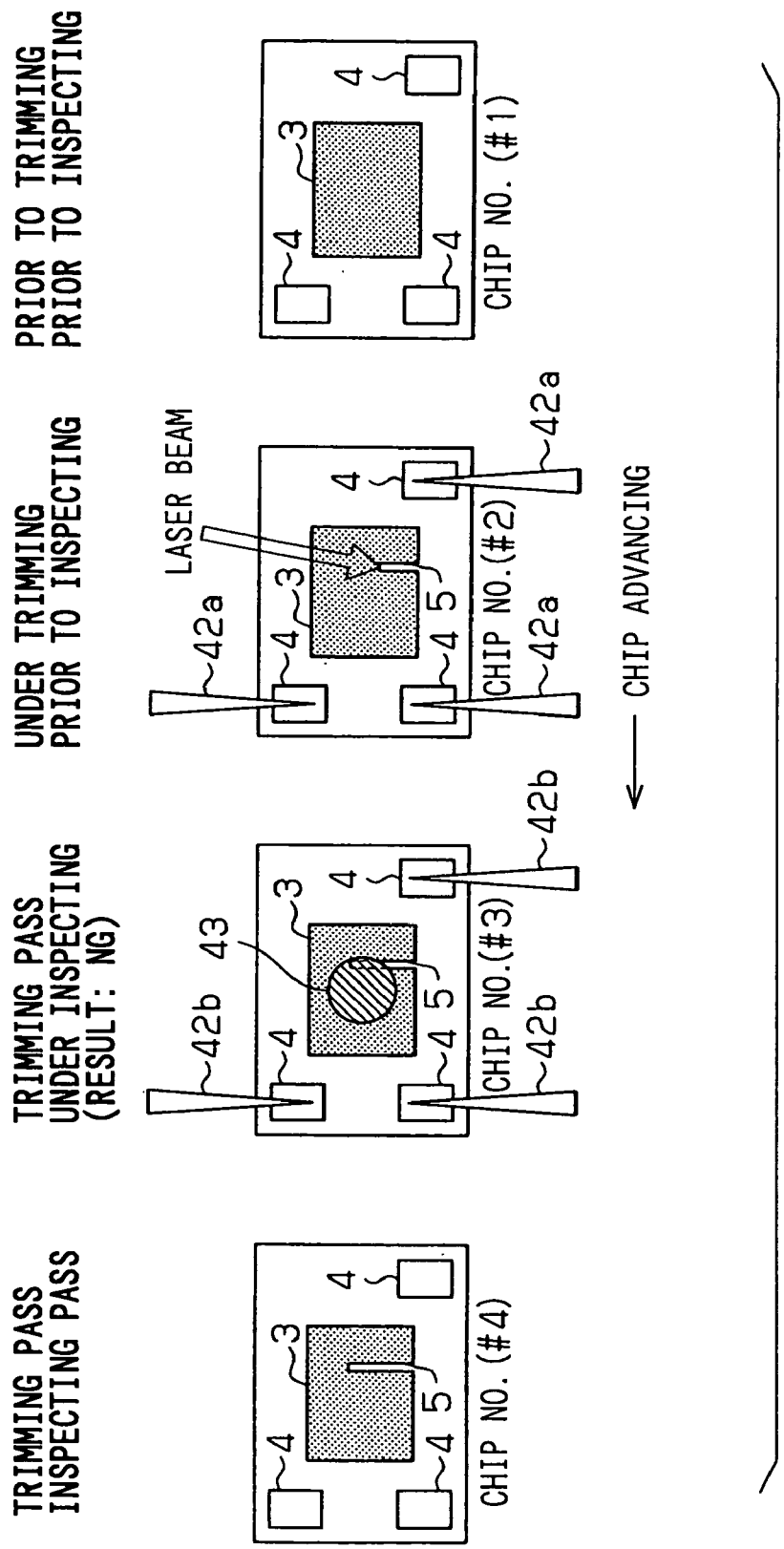
FIG. 5 is a plan view showing a process of trimming and inspecting in enlarged portions of a wafer.

When the given property is obtained in the wafer-inspecting, no action takes place as shown in the chip forming region (chip No. 3) in FIG. 4. By contrast, when the given property is not obtained in the wafer-inspecting, a bad mark 43 is attached as shown in the chip forming region (chip No. 3) in FIG. 5.

In detail, in FIG. 4, the chip forming region (chip No. 1) is just prior to trimming, so that it naturally prior to inspecting. The chip forming region (chip No.2) is just under trimming by laser trimming while three probe needles 42a are measuring the property of the IC so that a desired electric property is satisfied. Therefore, the chip forming region (chip No. 2) is prior to inspecting. The chip forming region (chip No. 3) has already undergone the trimming where the desired electric property has been obtained; further, the chip forming region (chip No. 3) has subsequently undergone inspecting of electric property in the entire IC circuit using three probe needles 42b. Now, FIG. 4 shows a successful result of the inspecting to the chip forming region (chip No. 3). By contrast, in FIG. 5, the chip forming region (chip No. 3) is determined to be defective with a bad mark 43 attached. Thus, the chip forming region (chip No. 2) and chip forming region (chip No. 3) undergo the trimming and the inspecting at once, respectively.

As shown in FIG. 3, a trimming process takes place in the chip No. 2 for a period T1 from t1 to t3. Simultaneously, an inspecting process takes place in the chip No. 3 for a period T2 from t1 to t2. Here, the trimming period T1 is longer than the inspecting period T2, so that a waiting period is present from t2 to t3 after the end of the inspecting process. In FIG. 3, the trimming period T1 is longer than the inspecting period T2; however, the trimming period T1 can be equal to or shorter than the inspecting period T2.

Figure 6:
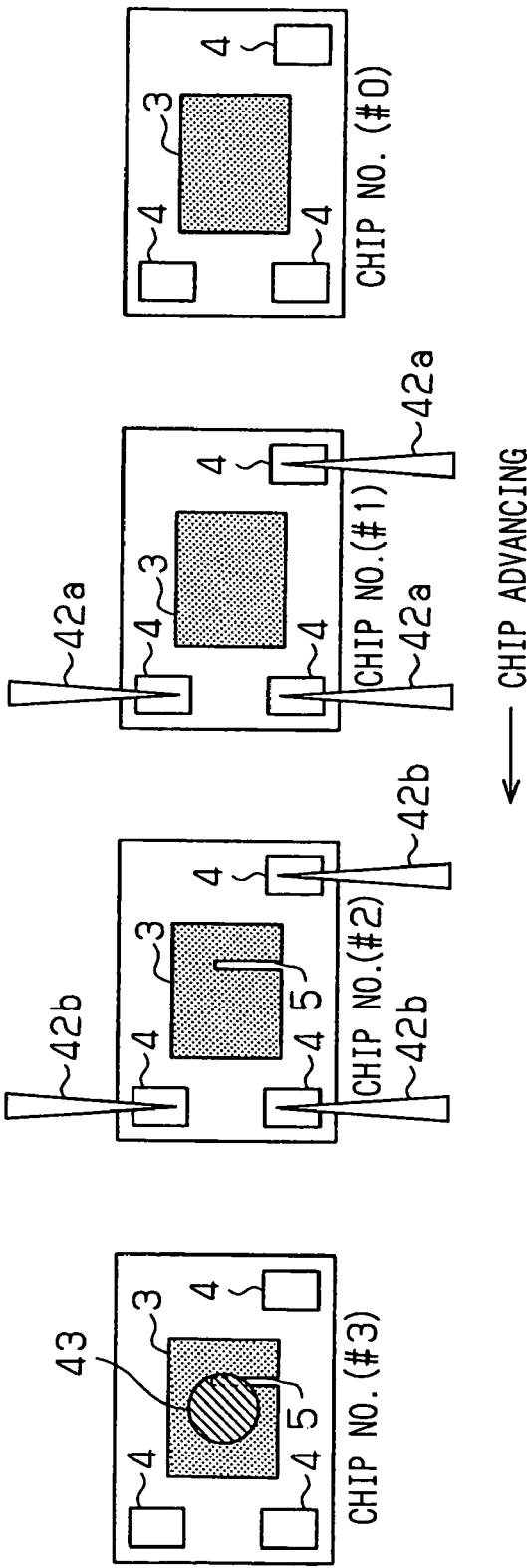
FIG. 6 is a plan view showing a process of trimming and inspecting in enlarged portions of a wafer.

At a timing t3 in FIG. 3, the shared prober 40 releases the probe needles 42a, 42b from the pads 4 and transfers the wafer stage 41 by one chip spacing, when receiving a trimming end signal from the trimming tester 30 (when the trimming process ends). Here, a period T3 from t3 to t4 is for transferring of the wafer stage 41. This transferring by one chip spacing changes a state from that in FIG. 5 to that in FIG. 6. Then, the probe needles 42a are engaged for contacting the pads 4 of the chip forming region (chip No, 1) prior to trimming, while the probe needles 42b are engaged for contacting the pads 4 of the chip forming region (chip No, 2) just posterior to trimming. The trimming and the inspecting are simultaneously performed while the probe needles 42a, 42b are at once engaged for contacting the pads 4.

In detail, in FIG. 3, a turning process takes place in the chip No. 1 for a period from t4 to t6. Simultaneously, an inspecting process takes place in the chip No. 2 for a period from t4 to t5. Here, the chip No. 2 that has undergone the laser trimming in FIG. 5 successively undergoes the inspecting process in FIG. 6.

In a conventional way shown in FIGS. 8, 9A to 9C, 10A to 10D, each of a trimmer and a wafer-inspecting device separately performs probing for thin-film trimming and wafer-inspecting, respectively. By contrast, in this embodiment, as shown in FIG. 1, the prober 40 is shared by the trimmer and the wafer-inspecting device, so that only a single prober is necessary, instead of two probers in FIG. 8. Since the number of probers becomes one from two, equipment investment can be decreased. Further, floor areas can be decreased by 20 to 30%.

Further, since the inspecting is performed while the trimming is performed, a process period apparently becomes approximately one half of that in the conventional way while the throughput approximately doubles. Further, a transferring period of chip by the prober becomes one half of that in the conventional way. Furthermore, since the resultant trimming state can be checked just after the trimming process, a great deal of defects can be prevented from occurring because of trimming property abnormality.

In the above explanation, the probe needles 42a for trimming are engaged in the pads corresponding to one chip forming region 2; however, they can be engaged in the pads corresponding to more than one chip forming regions 2 so that the trimming takes place in more than one chip forming regions 2. Likewise, the probe needles 42b for inspecting are engaged in the pads corresponding to one chip forming region 2; however, they can be also engaged in the pads corresponding to more than one chip forming regions 2 so that the inspecting takes place in more than one chip forming regions 2.

In the above explanation, the chip forming region 2 where the probe needles 42a are engaged and the chip forming region 2 where the probe needles 42b are engaged at once undergo the trimming and the inspecting, respectively. Then, the probe needles 42a and the probe needles 42b are newly engaged in the pads corresponding to the chip forming region that is prior to trimming and the pads corresponding to the chip forming region that is just posterior to trimming. This enables successive operation of the trimming and the inspecting. However, after the chip forming region 2 where the probe needles 42a are engaged and the chip forming region 2 where the probe needles 42b are engaged at once undergo the trimming and the inspecting, respectively, a different procedure can be adopted as follows. Namely, subsequently, the probe needles 42a and the probe needles 42b can be newly engaged in the pads corresponding to the chip forming region that is prior to trimming and the pads corresponding to the chip forming region that is prior to inspecting and not just posterior to trimming. Namely, in the above-described embodiment, the inspecting is performed just posterior to the trimming (i.e., the chip underwent trimming in the previous time undergoes the inspecting in the current time). However, a chip that underwent the trimming in the time before the previous time can undergo the inspecting in the current time. Otherwise, a chip that underwent the trimming in the time before two times from the current time can undergo the inspecting in the current time. Namely, the inspecting can be performed in the times other than the time just posterior to the trimming.

According to the above embodiment, the effects are obtained as follows:

(1) A semiconductor manufacturing device has a prober 40 whose probe needles 42a, 42b that can be engaged at once for contacting pads 4 on multiple chip forming regions 2 within a wafer 1. Using the prober 40, trimming is performed in at least one chip forming region 2 within the multiple chip forming regions 2 where the probe needles 42a, 42b are engaged. Simultaneously, inspecting posterior to trimming is performed in the multiple chip forming regions 2 excluding the at least one chip forming region 2. Therefore, the prober 40 can simultaneously engage the probe needles 42a, 42b on the multiple chip forming regions 2 within the wafer 1. While the at least one chip forming region 2 within the multiple chip forming regions 2 where the probe needles 42a, 42b are engaged undergoes trimming, the multiple chip forming regions 2 excluding the at least one chip forming region 2 undergoes inspecting posterior to trimming. This enables sharing of the prober in both of trimming and inspecting, which enables simple equipment to perform both of trimming and inspecting.

(2) Further, a prober 40 transfers a wafer stage 41 where a wafer 1 is mounted so that subsequent trimming and inspecting can be performed after whichever of the trimming and the inspecting ends later. Therefore, after the trimming and the inspecting are securely performed, the wafer 1 is transferred for the subsequent chip forming region 2 to undergo trimming and inspecting.

(3) In a semiconductor manufacturing method, a first step is as follows. Under a condition where probe needles 42a, 42b are at once engaged for contacting pads 4 on multiple chip forming regions 2 within a wafer 1, laser trimming is performed on a thin film 3 (trimming object) of at least one chip forming region 2 within the multiple chip forming regions 2 where the probe needles 42a, 42b are engaged so that a desired property can be obtained. Simultaneously, inspecting posterior to trimming is performed on the multiple chip forming regions 2 excluding the at least one chip forming region 2. Next, as a second step posterior to the first step, the probe needles 42a, 42b are released from the pads 4 which the probe needles 42a, 42b have been engaged for contacting, so that the probe needles 42a, 42b are newly engaged for contacting pads 4 on a chip forming region 2 that is prior to trimming and pads 4 on a chip forming region 2 that is posterior to trimming. Thereafter, the first step and the second step are repeated.

Consequently, the probe needles 42a, 42b are shared for both of trimming and inspecting, enabling trimming and inspecting using simple equipment. Further, at least one chip forming region 2 undergoes laser trimming, while another chip forming region 2 undergoes inspecting, which achieves simultaneous operation of laser trimming and wafer inspecting. This can decrease a period for the laser trimming and the wafer inspecting in comparison with a case where the laser trimming and the wafer inspecting are separately performed.

Here, in the second step, the probe needles 42b are released from the pads 4 where they are engaged so far, so as to be engaged on the pads 4 on the chip forming region 2 that is just posterior to trimming. Thus, just after the laser trimming is performed, inspecting can be successively performed, which enables prevention of occurrence of a great deal of trimming property abnormality since the resultant state can be inspected just after the trimming.

(4) In the second step, the prober 40 starts to transfer the wafer 1 so that the probe needles 42a, 42b are newly engaged for contacting pads 4 in accordance with whichever of the trimming and the inspecting ends later. Therefore, after the trimming and the inspecting are securely performed, the wafer 1 can be transferred.

Furthermore, the above embodiment can be modified as follows.

Figure 7:
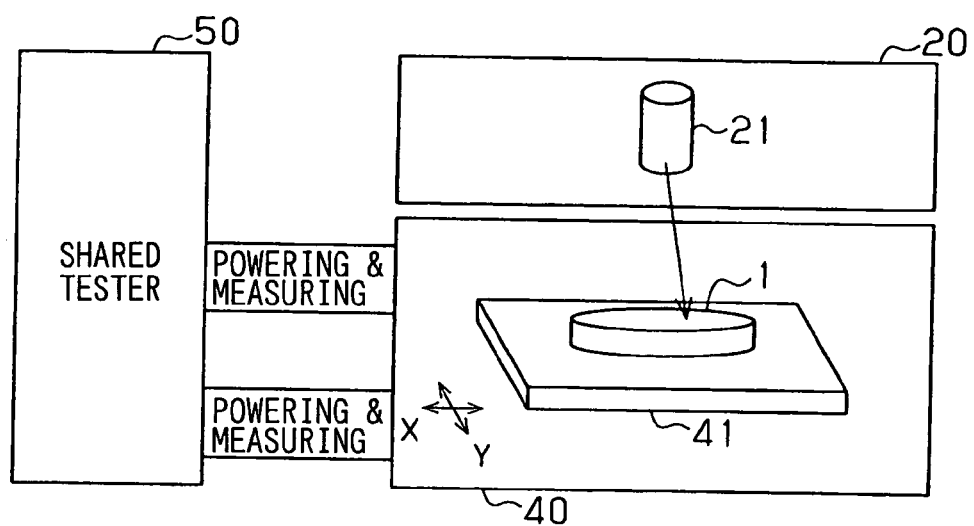
FIG. 7 is a diagram of showing a structure of a semiconductor manufacturing device (a trimmer and a wafer inspecting device) according to another embodiment of the present invention.
Figure 8:
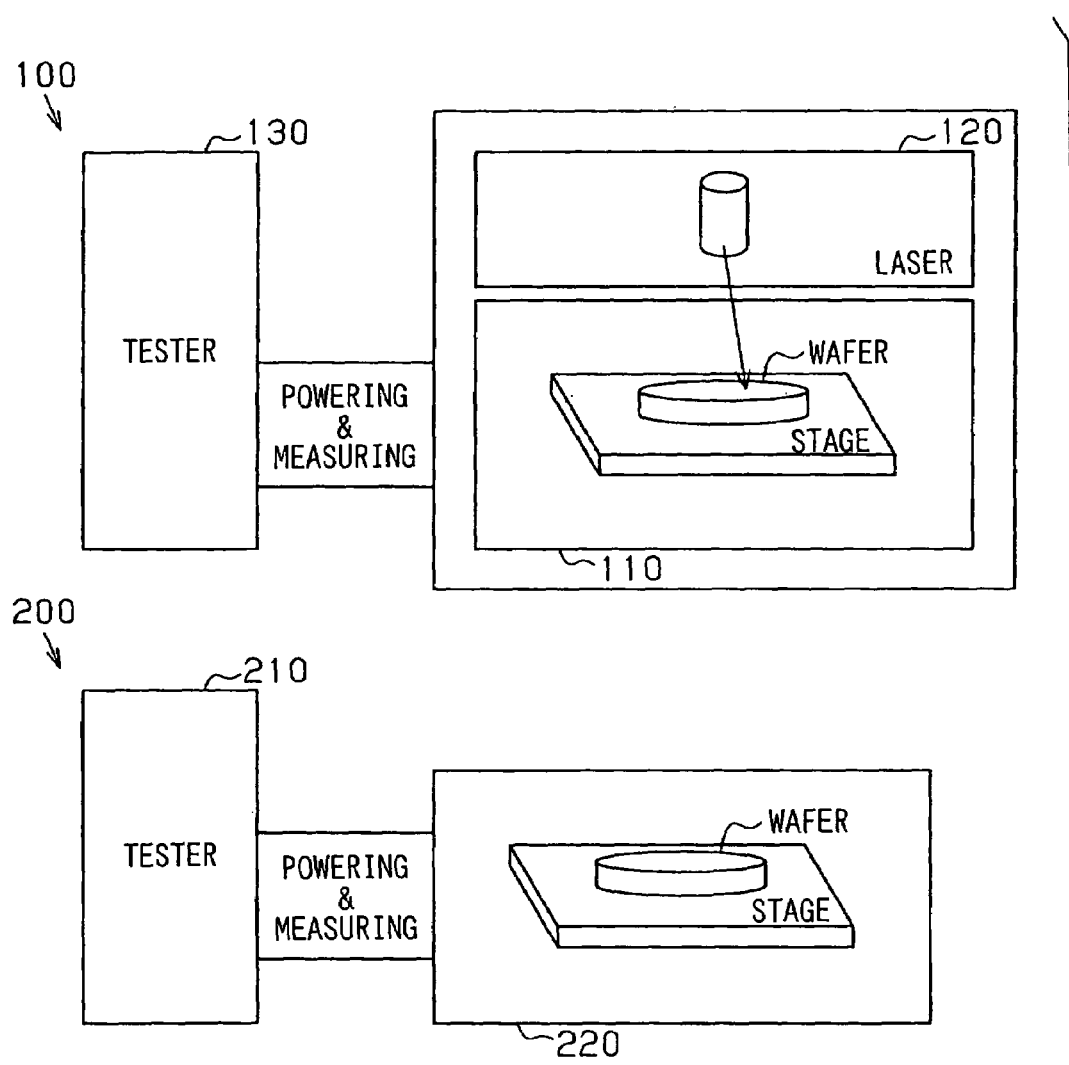
FIG. 8 is a diagram of showing a structure of a semiconductor manufacturing device (a trimmer and a wafer inspecting device) in a prior art.
Figure 9A:
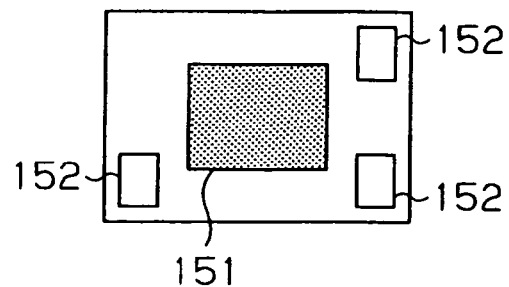
FIGS. 9A to 9C are plan views showing a process of trimming in enlarged portions of a wafer in a prior art.
Figure 9B:
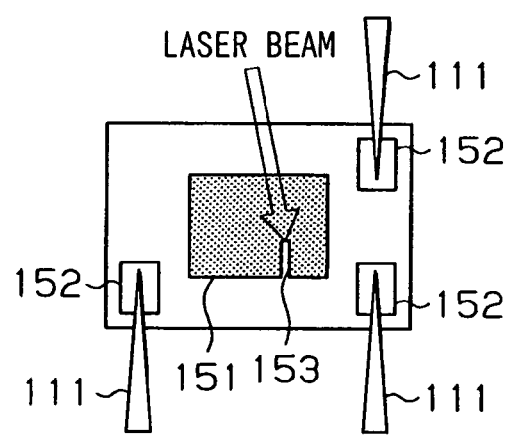
Figure 9C:
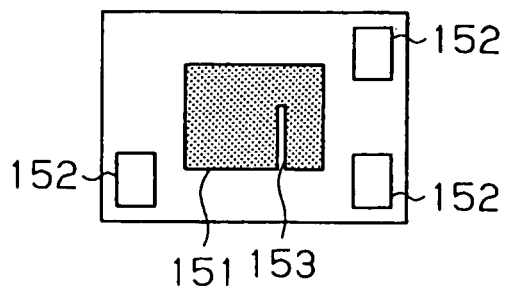
Figure 10A:
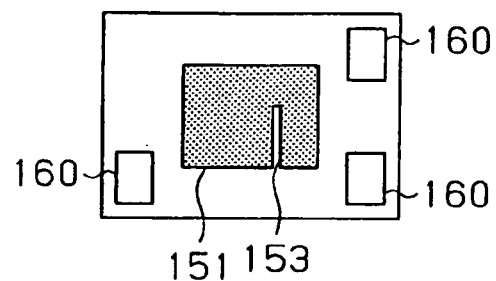
FIGS. 10A to 10D are plan views showing a process of inspecting in enlarged portions of a wafer in a prior art.
Figure 10B:
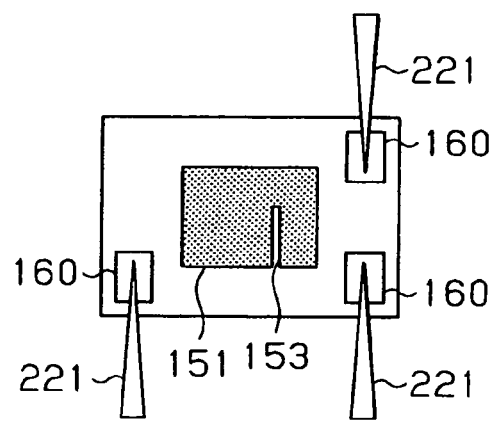
Figure 10C:
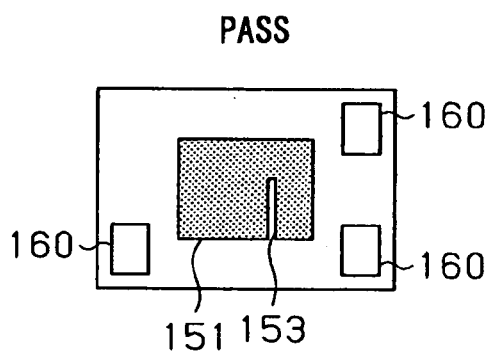
Figure 10D:
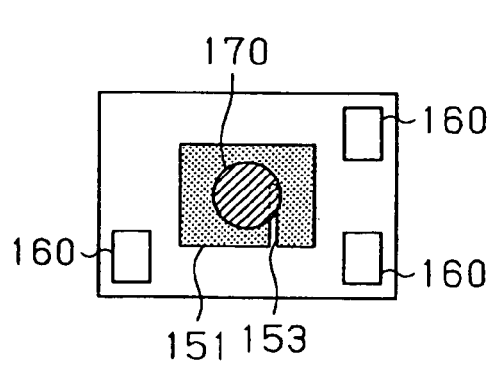

In FIG. 1, as testers, two of a wafer-inspecting tester 10 and a trimming tester 30 are used; however, if a tester is capable of processing multiple tasks, a single tester 50 for trimming and inspecting can be adopted as shown in FIG. 7.

It will be obvious to those skilled in the art that various changes may be made in the above-described embodiments of the present invention. However, the scope of the present invention should be determined by the following claims.

What is claimed is:

1. A semiconductor manufacturing device comprising:
   a wafer stage where a wafer is mounted; and
   a prober that performs, within a first cycle, both of
      (i) trimming in a first chip forming region, in which trimming has not yet been performed, wherein the first chip forming region is included in a plurality of chip forming regions of the wafer and
      (ii) inspecting a second chip forming region included in the plurality of chip forming regions, wherein the second chip forming region was previously trimmed,
   by causing a plurality of probing needles to simultaneously contact pads on the first chip forming region and the second chip forming region, wherein the wafer stage is transferred by the prober before the first cycle ends and after both of the trimming and the inspecting are completed,
   wherein the prober is then allowed to perform, within a second cycle, following the first cycle, both of
      (i) trimming a third chip forming region included in the plurality of chip forming regions and
      (ii) inspecting the first chip forming region, wherein trimming has been performed in the first chip forming region,
   by causing the plurality of probing needles to simultaneously contact pads on the third chip forming region and the first chip forming region.

2. The semiconductor manufacturing device of claim 1, wherein the trimming includes laser trimming.

3. A semiconductor manufacturing method using a prober that performs trimming and inspecting under a wafer state for a chip forming regions within a wafer, the semiconductor manufacturing method comprising:
   a first step of performing, within a certain period, both of
      (i) trimming an object in a first chip forming region to obtain a desired property for the object, wherein the first chip forming region is included in a plurality of chip forming regions of the wafer, and
      (ii) inspecting a second chip forming region, in which trimming has been performed, wherein the second chip forming region is included in the plurality of chip forming regions, and wherein the chip forming regions are in a wafer state, under a condition where probe needles are caused to simultaneously contact pads on the first chip forming region and the second chip forming region; and a second step of performing, after the certain period ends,
(i) releasing the probe needles from the pads on the first chip forming region and the second chip forming region and then
(ii) transferring the wafer, so that so that the probe needles are allowed to newly contact pads, for trimming, on a third chip forming region, in which trimming has not yet been performed, wherein the pads on the third chip forming region are included in the plurality of chip forming regions, and pads, for inspecting, on the first chip forming region, in which trimming has been performed.

4. The semiconductor manufacturing method of claim 3, wherein the trimming includes laser trimming.

* * * * *